_(12)_ United States Patent
Dede

(10) Patent No.: US 10,388,810 B1
(45) Date of Patent: Aug. 20, 2019

(54) POWER ELECTRONICS ASSEMBLIES HAVING OPTICONDISTORS AND AN EMBEDDED ACTIVE COOLING CHIP

(71) Applicant: Toyota Motor Engineering & Manufacturing North America, Inc., Plano, TX (US)

(72) Inventor: Ercan M Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/017,280

(22) Filed: Jun. 25, 2018

(51) Int. Cl.

| | |
|---|---|
| *H01L 31/02* | (2006.01) |
| *H01L 31/024* | (2014.01) |
| *H01L 31/0224* | (2006.01) |
| *H01C 1/082* | (2006.01) |
| *H01L 31/028* | (2006.01) |
| *H01L 31/0304* | (2006.01) |
| *H01L 31/0232* | (2014.01) |

(52) U.S. Cl.
CPC .......... *H01L 31/024* (2013.01); *H01C 1/082* (2013.01); *H01L 31/028* (2013.01); *H01L 31/0224* (2013.01); *H01L 31/02327* (2013.01); *H01L 31/03044* (2013.01)

(58) Field of Classification Search
CPC ............. H01L 31/024; H01L 31/03044; H01L 31/0224; H01L 31/0237; H01C 1/082
See application file for complete search history.

(56) References Cited

U.S. PATENT DOCUMENTS

| | | | |
|---|---|---|---|
| 6,780,678 B2 | 8/2004 | Simon et al. | |
| 8,018,717 B2* | 9/2011 | Corbeil | A61B 6/037 165/104.33 |
| 8,110,415 B2* | 2/2012 | Knickerbocker | H01L 25/0652 257/712 |
| 8,179,676 B2 | 5/2012 | Julien et al. | |
| 8,448,532 B2* | 5/2013 | Martin | G01N 1/405 73/863.12 |
| 8,546,930 B2 | 10/2013 | Bakir et al. | |
| 8,564,007 B2 | 10/2013 | Herrmann | |
| 8,655,125 B2 | 2/2014 | Marks et al. | |

(Continued)

FOREIGN PATENT DOCUMENTS

| | | |
|---|---|---|
| JP | 2009218299 A | 9/2009 |
| WO | 2010115415 A2 | 10/2010 |

*Primary Examiner* — William Coleman
(74) *Attorney, Agent, or Firm* — Dinsmore & Shohl LLP

(57) ABSTRACT

A power electronics assembly includes a cooling chip having a first subassembly and a second subassembly. The cooling chip includes a first metallization layer and a second metallization layer on a portion of a first surface of the cooling chip, an inlet through a second surface of the cooling chip opposite to the first surface, an outlet through the second surface, and one or more micro-channels extending between and fluidly coupled to the inlet and the outlet. The first subassembly includes a light source coupled to a first electrode and the first metallization layer, which provides a second electrode. The light source is configured to receive an electrical signal and operable to produce light in response to the electrical signal. The second subassembly includes one or more wide band gap semiconductor photonic cores acting as an electric switch positioned to receive the light produced by the light source.

20 Claims, 7 Drawing Sheets

(56) References Cited

U.S. PATENT DOCUMENTS

| | | | |
|---|---|---|---|
| 8,655,152 B2 | 2/2014 | Marks et al. | |
| 8,660,157 B2 | 2/2014 | Huff et al. | |
| 9,113,576 B2 | 8/2015 | Daly | |
| 9,142,339 B2 | 9/2015 | Sampayan | |
| 9,196,817 B2 | 11/2015 | Werne et al. | |
| 9,419,721 B2 | 8/2016 | Sampayan | |
| 9,646,916 B1* | 5/2017 | Emma | H04B 10/2503 |
| 9,648,782 B2* | 5/2017 | Brunschwiler | H01L 23/367 |
| 9,748,859 B2 | 8/2017 | Sampayan | |
| 9,749,958 B1 | 8/2017 | Segev et al. | |
| 10,157,817 B1* | 12/2018 | Zhou | H01L 23/4336 |
| 10,231,364 B2* | 3/2019 | Dede | H01L 35/00 |
| 2017/0092565 A1* | 3/2017 | Chen | H01L 23/473 |
| 2018/0061738 A1* | 3/2018 | Chainer | H01L 23/473 |
| 2018/0145010 A1* | 5/2018 | Fukuoka | H01L 23/3672 |
| 2018/0158756 A1* | 6/2018 | Smoot | H01L 23/427 |
| 2018/0294205 A1* | 10/2018 | Chainer | H01L 23/473 |
| 2019/0094925 A1* | 3/2019 | Kulkarni | H01L 21/02225 |

* cited by examiner

POWER ELECTRONICS ASSEMBLIES HAVING OPTICONDISTORS AND AN EMBEDDED ACTIVE COOLING CHIP

TECHNICAL FIELD

Embodiments described herein generally relate to power electronics devices and, more particularly, to power electronics assemblies having opticondistors and an embedded cooling chip as well as methods of cooling the opticondistor using the cooling chip.

BACKGROUND

Worldwide environmental, economic, and political factors are pushing industries away from fossil fuels and towards electrification. In the automotive industry, this is encouraging the adoption of electric motors and other systems in electric personal vehicles, buses, trucks, and trains at an increasing pace. Ever increasing steps towards autonomous vehicles are pushing the integration of large numbers of sensors and smart devices into each vehicle. High power and high switching rates create an electrically noisy environment in which sensitive electronic and electrical components can malfunction if they are not properly isolated.

Electromagnetic interference-free (EMI-free) power electronics applications have necessitated the development of optical switching technology. One example is an opticondistor, which includes a photonic core that uses a wide band gap (WBG) semiconductor material that exhibits photoconductivity and allows a current flow therethrough when light is incident on it. The photonic core provides unique features that enable versatile circuit applications to either replace the semiconductor transistor-based circuit elements or semiconductor diode-based circuit elements.

Traditionally, the cooling of a power electronics device is achieved by packaging the device between metal and ceramic layers with remote cooling (for example, by using a separate cold plate) to achieve designed electrical function, while allowing for effective heat transfer. However, the package metal and ceramic layers become a bottleneck for increased thermal performance as power density increases. Additionally, a light source must be aligned with the photonic core in the opticondistor in order to activate the electrical switch. An improved strategy for compact packaging that provides enhanced thermal performance and device alignment in an opticondistor is thus desirable.

SUMMARY

Various embodiments of power electronics assemblies having an opticondistor and an embedded active cooling chip are described. In one embodiment, a power electronics assembly includes a first cooling chip made of a semiconductor material, and a first subassembly and a second subassembly mounted on the first cooling chip. The first cooling chip includes a first metallization layer and a second metallization layer on a portion of a first surface of the first cooling chip, at least one inlet through a second surface of the first cooling chip, wherein the second surface is opposite to the first surface, at least one outlet through the second surface of the first cooling chip, and one or more micro-channels extending between and fluidly coupled to the at least one inlet and the at least one outlet. The first subassembly includes a first light source coupled to the first metallization layer and a first electrode, wherein the first metallization layer provides a second electrode. The first light source is configured to receive an electrical signal and operable to produce light in response to the electrical signal. The second subassembly includes one or more photonic cores positioned to receive the light produced by the first light source, wherein the one or more photonic cores comprise a wide band gap semiconductor material.

In another embodiment, a power electronics assembly includes a first semiconductor cooling chip, a second semiconductor cooling chip and a third semiconductor cooling chip arranged as a parallel layer in a vertical stack. Each of the first semiconductor cooling chip and the second semiconductor cooling chip includes a first metallization layer and a second metallization layer on a portion of a top surface of the respective semiconductor cooling chip, at least one inlet through a bottom surface of the respective semiconductor cooling chip, at least one outlet through the bottom surface of the respective semiconductor cooling chip and one or more micro-channels extending between and fluidly coupled to the at least one inlet and the at least one outlet. A first subassembly and a second subassembly are mounted on each of the first semiconductor cooling chip and the second semiconductor cooling chip. The first subassembly includes a first light source coupled to the first metallization layer and to a bottom surface of a first electrode configured to support a semiconductor cooling chip on a top surface thereof, wherein the first metallization layer provides a second electrode. The first light source is configured to receive an electrical signal and operable to produce light in response to the electrical signal. One or both of the first electrode and the second electrode are operable as input terminals to receive an input-controlling signal. The second subassembly includes one or more photonic cores positioned to receive the light produced by the first light source, wherein the one or more photonic cores comprise a wide band gap semiconductor material. Each photonic core of the second subassembly is coupled to the second metallization layer and a bottom surface of a third electrode is configured to support the third semiconductor cooling chip on a top surface thereof. The second metallization layer provides a fourth electrode to allow an electric current to flow between the third electrode and the fourth electrode. The electric current between the third electrode and the fourth electrode is controlled at least in-part by the input-controlling signal. A third metallization layer is provided on a portion of a top surface of the third semiconductor cooling chip. The third electrode of the first semiconductor cooling chip is electrically connected to the fourth electrode of the second semiconductor cooling chip and the third electrode of the second semiconductor cooling chip is electrically connected to the third metallization layer of the third semiconductor cooling chip.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein relate to power electronics assemblies having an opticondistor and an embedded active cooling chip. The opticondistors described herein include a light source and one or more WBG semiconductor photonic cores positioned to receive the light produced by the light source. The light source is configured to receive an electrical signal and operable to produce light in response to the electrical signal. In embodiments described herein, both the laser subassembly and the photonic core subassembly of the opticondistor are constructed using a semiconductor cooling chip as a substrate. A first metallization layer is deposited on top of the cooling chip to achieve an electrically isolated mounting pad for the light source. A second metallization layer is similarly deposited on top of the cooling chip to act as an electrode for the one or more WBG semiconductor photonic cores. In response to the light received, electric current flows through the photonic cores which act as electrical switches. This design enables the heat generated during the operation of the opticondistor to reach the cooling chip, while still maintaining alignment of the light source with the photonic cores. The cooling chip has a fluid inlet, a fluid outlet and a number of micro-channels fluidly connected to the fluid inlet and the fluid outlet. A cooling fluid is circulated through the micro-channels in the cooling chip to continuously remove the heat generated, thereby keeping the opticondistor at an optimal temperature for a highly efficient and reliable cooling performance. Various embodiments of the opticondistor are described in greater detail below.

Figure 1:
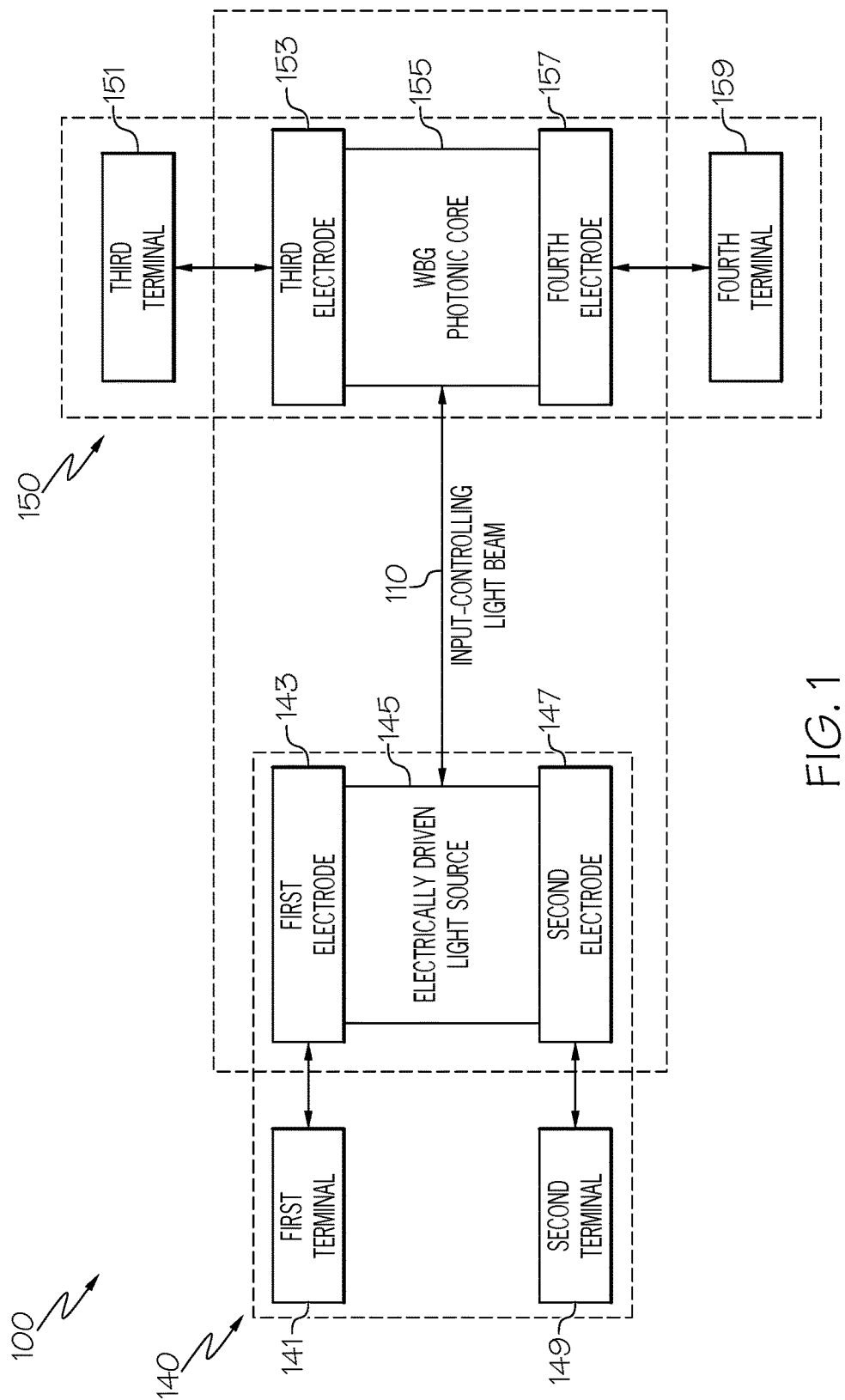
FIG. 1 schematically illustrates an example opticondistor, according to one or more embodiments described and illustrated herein.

Referring now to the drawings, FIG. 1 schematically illustrates an example opticondistor 100. The opticondistor 100 includes a first subassembly 140 and a second subassembly 150. The first subassembly 140 includes an electrically driven light source 145 such as, but not limited to, a semiconductor laser, a semiconductor light-emitting diode or a laser bar. The light source 145 is electrically coupled to a first terminal 141 through a first electrode 143. The light source 145 is also electrically coupled to a second terminal 149 through a second electrode 147. Each of the first terminal 141 and the second terminal 149 may be positively coupled to a voltage source or grounded such that a control current can flow between the first terminal 141 and the second terminal 149. When the control current flows between the first terminal 141 and the second terminal 149, the light source 145 gets energized to produce an input-controlling light beam 110 (for example, a laser beam) in response to the control current. The intensity of the light beam 110 can be controlled or modulated by the control current inputted through the first terminal 141 or the second terminal 149.

The second subassembly 150 includes a photonic core 155 positioned to receive the light beam 110 produced by the light source 145. The photonic core 155 is made from a WBG semiconductor material capable of exhibiting photoconductivity such as, but not limited to, silicon carbide (SiC), gallium nitride (GaN), aluminum nitride (AlN), boron nitride (BN), diamond, or the like. As a non-limiting example, the WBG semiconductor material may be any semiconductor material comprising a bandgap of about 3 eV or more. When optical energy is directed into the WBG semiconductor material and absorbed, the WBG semiconductor material produces charge carriers from the absorbed light to become electrically conductive as the resistance drops to a small value (much less than the circuit impedance).

The photonic core 155 is electrically coupled to a third terminal 151 through a third electrode 153 and to a fourth terminal 159 through a fourth electrode 157. When the light beam 110 is incident on the photonic core 155, electric current flows between the third electrode 153 and the fourth electrode 157 through the photonic core 155. Each of the third terminal 151 and the fourth terminal 159 may be positively coupled to a voltage source or grounded such that electric current can flow between the third terminal 151 and the fourth terminal 159. The electric current thus outputted can be controlled by the intensity of the light beam 110 incident on the photonic core 155. In some implementations, the electrical output thus controlled at least in-part by the intensity of the input-controlling light beam 110 may be varied by continuously varying the control current inputted through the first terminal 141 or the second terminal 149.

The light beam 110 may travel between the light source 145 and the photonic core 155 either by free space transmission (e.g., through air, gas, vacuum, etc., with or without the use of reflective surfaces, lenses, or diffractive elements) or through some type of optical element (e.g., one or more optical fibers, prisms, or mirrors). Since the light source 145 and the photonic core 155 are electrically isolated, the light source 145 may be operated at a first voltage potential, and the photonic cores may be operated at a second, different voltage potential. Multiple photonic cores 155 can be stacked independently, allowing the application and control of a high-voltage operation from the light source 145. Thus, the opticondistor 100 can be configured based on various hardware structures using a single piece or multiple layers of WBG semiconductor material to achieve desirable electrical properties such as high switching voltages by using the photoconductive property beyond the breakdown voltages of the semiconductor devices/circuits operated based on the electrical bias or control designs. For example, a single photonic core made of 100 micron thick WBG semiconductor crystal can withstand up to 40 kV and thus replace at least ten equivalent junction devices such as a transistor or a diode having breakdown voltage in the range of 40-4000 V.

Figure 2A:
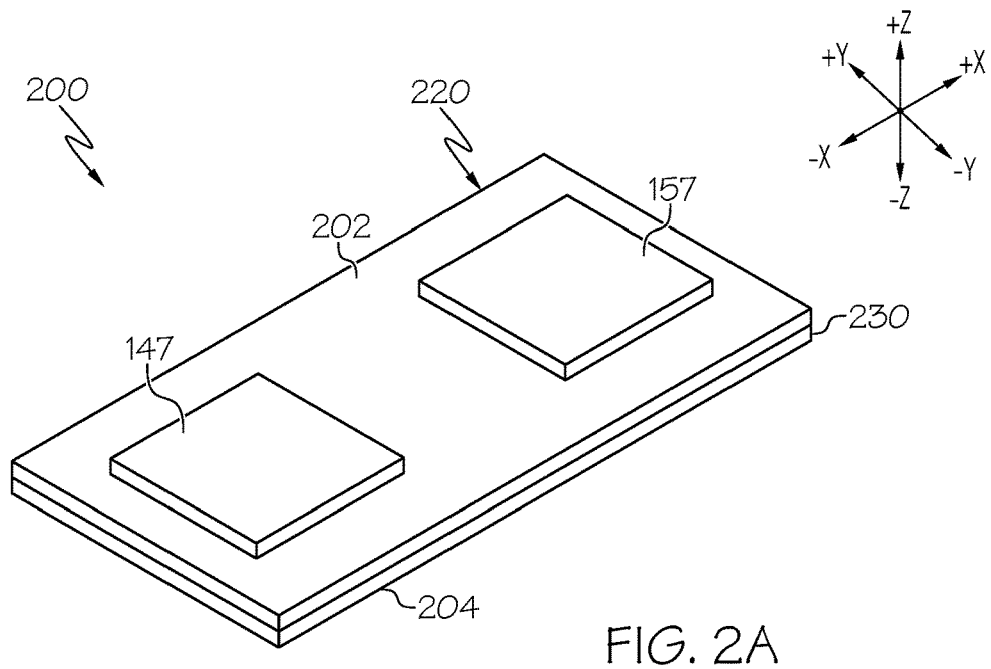
FIG. 2A schematically illustrates an isolated perspective view of an example cooling chip, according to one or more embodiments described and illustrated herein.
Figure 2B:
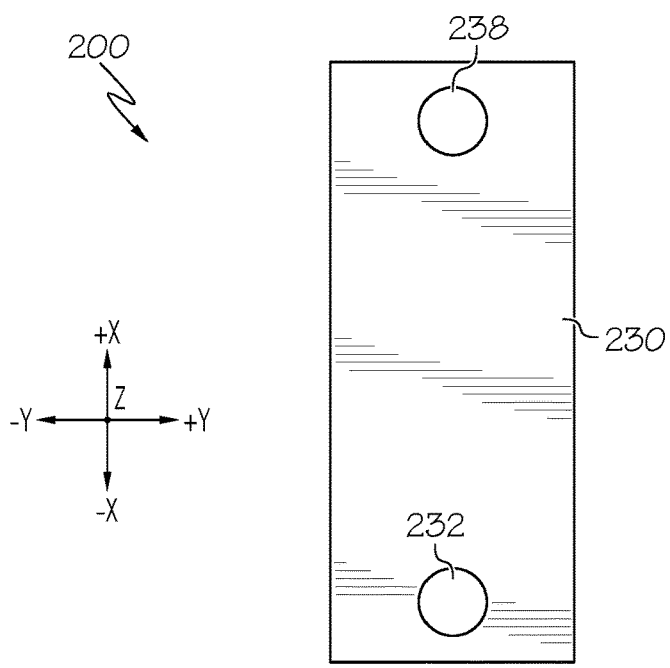
FIG. 2B schematically illustrates an isolated bottom view of the example cooling chip of FIG. 2A, according to one or more embodiments described and illustrated herein.
Figure 2C:
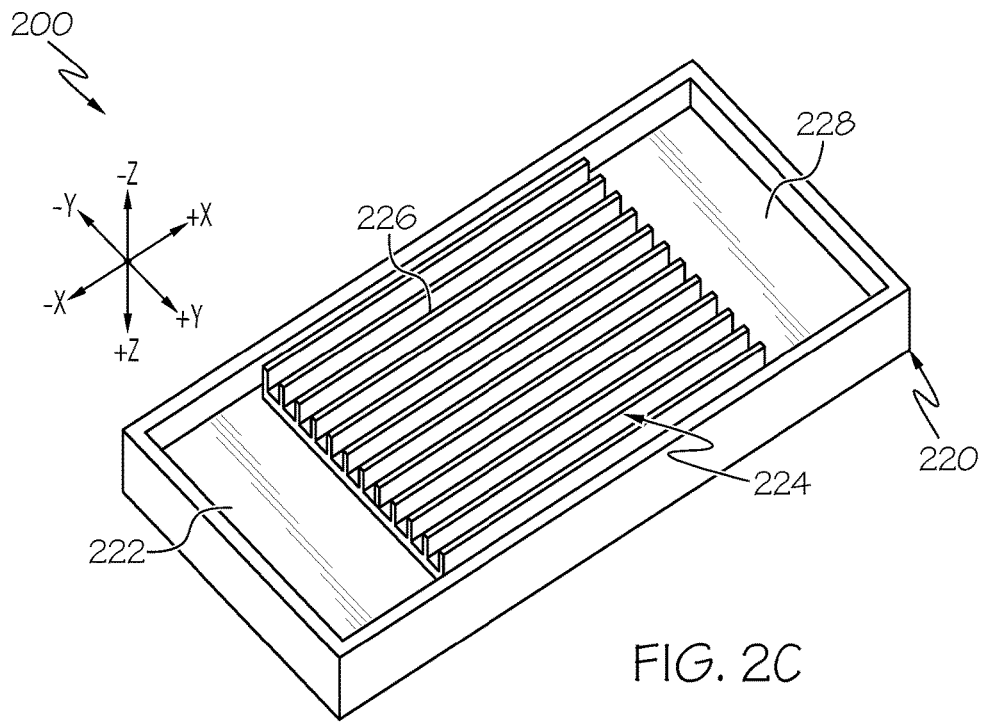
FIG. 2C schematically illustrates an isolated perspective view of an upper layer of the example cooling chip of FIG. 2A, according to one or more embodiments described and illustrated herein.
Figure 2D:
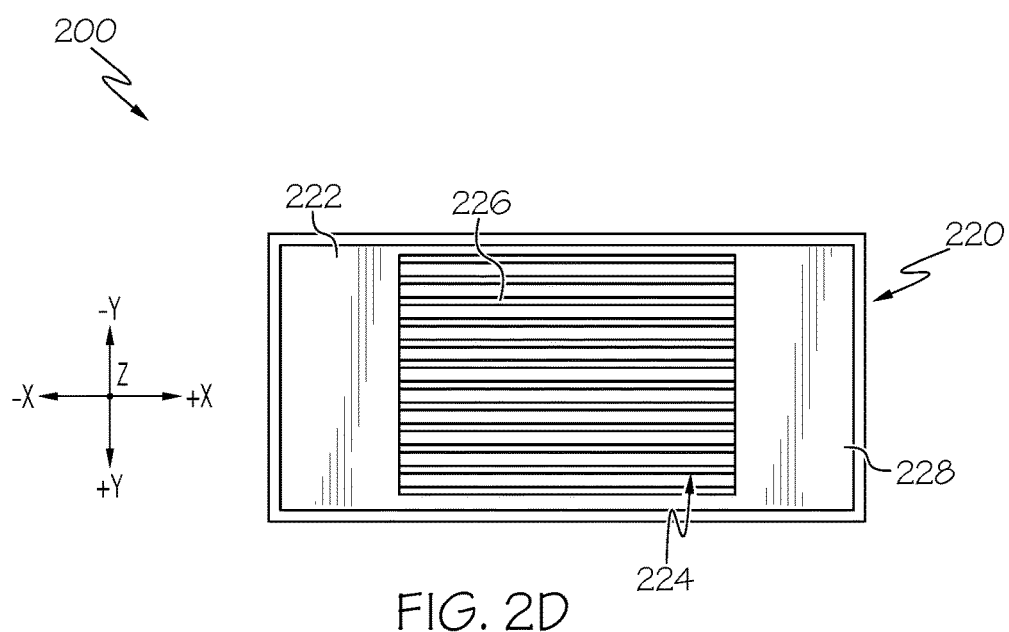
FIG. 2D schematically illustrates an isolated top view of the upper layer of the example cooling chip of FIG. 2A, according to one or more embodiments described and illustrated herein.

FIG. 2A is an isolated perspective view of an example cooling chip 200, and FIG. 2B is an isolated bottom view of the cooling chip 200 of FIG. 2A. FIG. 2C is an isolated perspective view of an upper layer 220 of the cooling chip 200 and FIG. 2D is an isolated top view of the upper layer 220 of the cooling chip 200. While only the cooling chip 200 is described with regards to FIGS. 2A-2D, it should be appreciated that other cooling chips described herein may have similar structure. The cooling chip 200 includes the upper layer 220 and a lower layer 230. The upper layer 220 is positioned above the lower layer 230 in the system vertical direction (i.e., along the +/−Z-axis of the coordinate axes of FIG. 2A). Further, the upper layer 220 includes the top surface 202 of the cooling chip 200 upon which a metallization layers 147 and 157 (shown in FIG. 3) are deposited using any known or yet to be developed deposition methods. The lower layer 230 includes the bottom surface 204 of the cooling chip 200. The lower layer 230 includes a fluid inlet 232, and a fluid outlet 238, which are configured as openings. The fluid inlet 232 is longitudinally (i.e., along the +/−X-axis of the coordinate axes of FIG. 2A) spaced apart from the fluid outlet 238. The upper layer 220 is bonded to the lower layer 230 by any suitable process to form one or more micro-channels 224 therein.

The upper layer 220 provides the plurality of micro-channels 224 and the lower layer 230 provides the fluid inlet 232 and the fluid outlet 238 as described in greater detail below. The upper layer 220 includes an inlet pocket 222 and an outlet pocket 228. The inlet pocket 222 is longitudinally (i.e., along the +/−X-axis of the coordinate axes of FIG. 2A) spaced apart from the outlet pocket 228. Disposed between the inlet pocket 222 and the outlet pocket 228 is the plurality of micro-channels 224. The plurality of micro-channels 224 may extend longitudinally (i.e., along the +/−X-axis of the coordinate axes of FIG. 2A) from the inlet pocket 222 to the outlet pocket 228. In the embodiment of the plurality of micro-channels 224, as depicted in FIGS. 2C and 2D, the plurality of micro-channels 224 are between the top surface 202 of the upper layer 220 and the bottom surface 204 of the lower layer 230. The plurality of micro-channels 224 may be defined by an array of fins 226 such as, but not limited to, pin fins, channel fins, or the like, that collectively define at least a portion the fluid flow path. The array of fins 226 increase the surface area of the cooling chip 200 such that a cooling fluid flowing therethrough may contact an increased surface area of the cooling chip 200. The plurality of micro-channels 224 may have a straight design, or curvilinear design. Moreover, in some embodiments, the upper layer 220, the lower layer 230, the inlet pocket 222, the outlet pocket 228 and the plurality of micro-channels 224 may be etched in semiconductor material such as silicon, for example. Further, the array of fins 226 may be disposed at the fluid inlet 232 and the fluid outlet 238, such that the plurality of micro-channels 224 of the cooling chip 200 is in fluid communication with the fluid inlet 232 and the fluid outlet 238.

Figure 3:
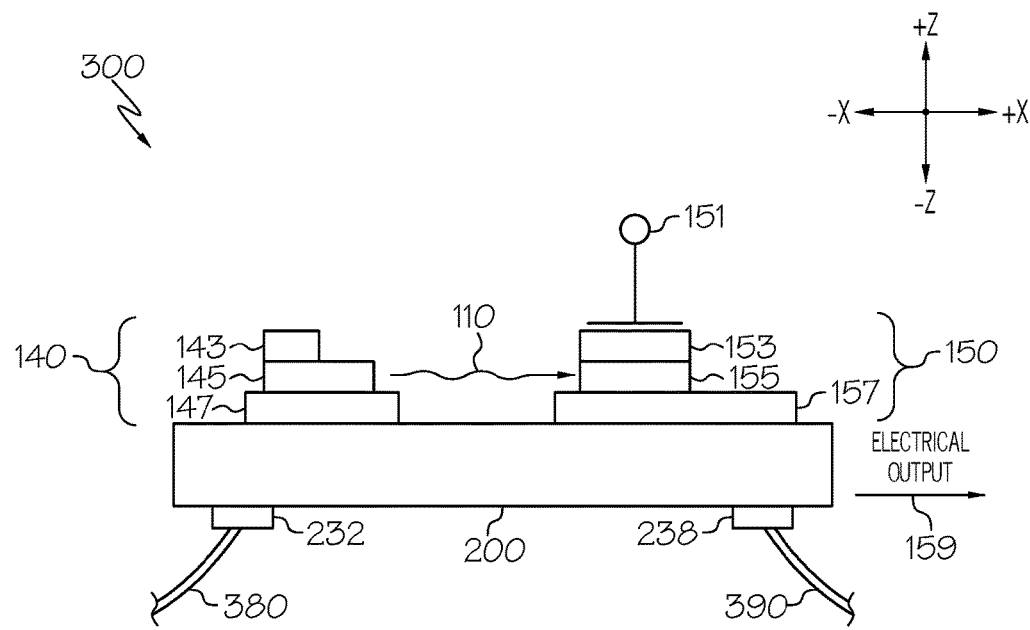
FIG. 3 schematically depicts a side view of an example power electronics assembly having an opticondistor and an embedded active cooling chip, where the opticondistor has a single photonic core, according to one or more embodiments described and illustrated herein.

FIG. 3 schematically depicts a side view of an example power electronics assembly 300 having the opticondistor (such as the example opticondistor 100 shown in FIG. 1) and an embedded active cooling chip 200. The power electronics assembly 300 has a first subassembly 140 and a second subassembly 150, both mounted on the cooling chip 200. The first subassembly 140 has a light source 145 coupled to a first electrode 143 and the metallization layer 147, which acts as the second electrode. The second subassembly 150 has a photonic core 155 coupled to a third electrode 153 and the metallization layer 157, which acts as the fourth electrode to allow a current to flow between the third electrode 153 and the metallization layer 157 through the photonic core 155.

Mounting at the various interfaces may be achieved using conventional soldering techniques, silver sintering, silver-filled epoxy, or high temperature die attach techniques such as transient liquid phase (TLP) bonding. In the embodiment shown in FIG. 3, the metallization layers 147 and 157 are provided on the cooling chip 200. As discussed above, the cooling chip 200 has a fluid inlet 232 and a fluid outlet 238 through the bottom surface 204. The fluid inlet 232 is fluidly coupled to a fluid injection conduit 380. The fluid outlet 238 is fluidly coupled to a fluid extraction conduit 390. In some embodiments, an intermediate electrically-conducting substrate (not shown) may be placed between the light source 145 and the cooling chip 200 or between the photonic core 155 and the cooling chip 200 such that the light source 145 aligns with the photonic core 155.

The light source 145 is configured to receive an electrical signal through either the first electrode 143 or the metallization layer 147 and generates a light beam 110 in response to the electrical signal flowing between the first electrode 143 and the metallization layer 147. The photonic core 155 is positioned to receive the light beam 110 produced by the light source 145. In some embodiments, the light beam 110 may travel between the light source 145 and the photonic core 155 either through air or through some type of an optical element such as, but not limited to, one or more optical fibers, prisms, or mirrors (not shown). In response to the light beam 110 received on the photonic core 155, an electric current flows between the third terminal 151 and the fourth terminal 159 (shown in FIG. 1) coupled to the third electrode 153 and the metallization layer 157 respectively.

Figure 4:
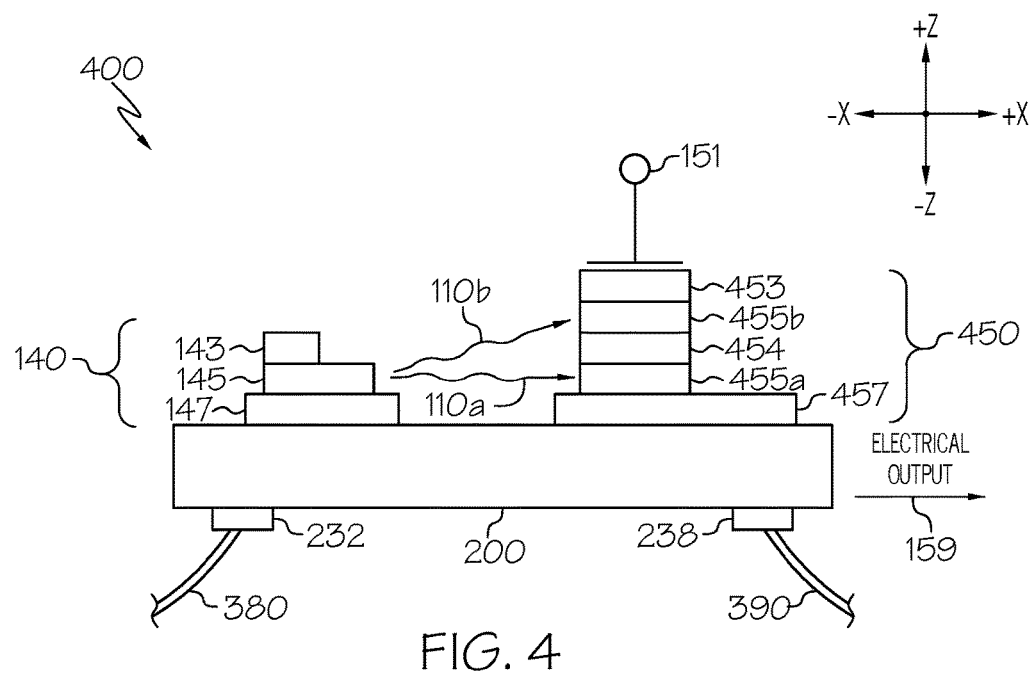
FIG. 4 schematically depicts a side view of an example power electronics assembly having an opticondistor and an embedded active cooling chip, where the opticondistor has multiple photonic cores stacked vertically, according to one or more embodiments described and illustrated herein.

FIG. 4 schematically depicts a side view of an example power electronics assembly 400 having an opticondistor (such as the example opticondistor 100 shown in FIG. 1) and an embedded active cooling chip 200, where the power electronics assembly 400 has two photonic cores stacked vertically. Multiple photonic cores can be stacked vertically in other embodiments. Such a stacked configuration enables a very high switching voltage to be generated across the stack of multiple photonic cores. This provides a significant advantage since many circuits based on conventional junction technology are unable to generate such high voltages without adding significantly more complexity. In the embodiment shown in FIG. 4, the power electronics assembly 400 can switch twice the amount of voltage compared to the power electronics assembly 300 having a single photonic core.

In the embodiment shown in FIG. 4, the power electronics assembly 400 has two photonic cores 455a, 455b stacked vertically, though in other embodiments, there may be more than two photonic cores. The power electronics assembly 400 has a first subassembly 140 and a second subassembly 450, both mounted on the cooling chip 200. The first subassembly 140 has a light source 145 coupled to a first electrode 143 and the metallization layer 147, which acts as the second electrode. In the embodiment shown in FIG. 4, the second subassembly 450 has two photonic cores 455a, 455b stacked vertically. An electrode 454 is provided between any two successive photonic cores such as between the photonic cores 455a, 455b shown in FIG. 4. The uppermost photonic core 455b in FIG. 4, is coupled to a third electrode 453 and the lowermost photonic core 455a in FIG. 4 is coupled to the metallization layer 457, which acts as the fourth electrode to allow a current to flow between the third electrode 453 and the metallization layer 457 through the photonic cores 455a, 455b and the electrode 454. The metallization layers 147 and 457 are provided on the cooling chip 200 described above. In some embodiments, an intermediate electrically-conducting substrate (not shown) may be placed between the light source 145 and the cooling chip 200 or between the photonic core 455a and the cooling chip 200 such that the light source 145 aligns with the photonic core 455a.

The light source 145 is configured to receive an electrical signal through either the first electrode 143 or the metallization layer 147 and generates light beams 110a and 110b in response to the electrical signal flowing between the first electrode 143 and the metallization layer 147. The photonic core 455a is positioned to receive the light beam 110a, while the photonic core 455b is positioned to receive the light beam 110b. In some embodiments, the light beams 110a, 110b may travel between the light source 145 and the photonic cores 455a, 455b either through air or through some type of an optical element, such as but not limited to one or more optical fibers, prisms, or mirrors (not shown). In response to the light beams 110a and 110b received on the photonic cores 455a and 455b respectively, an electric current flows between the third terminal 151 coupled to the third electrode 453 and the fourth terminal 159 coupled to the metallization layer 457. In some embodiments, an optical element such as a beam splitter may be used to split a single beam generated by the light source 145 into the multiple beams. In other embodiments, multiple light sources may be used to generate multiple beams.

Figure 5A:
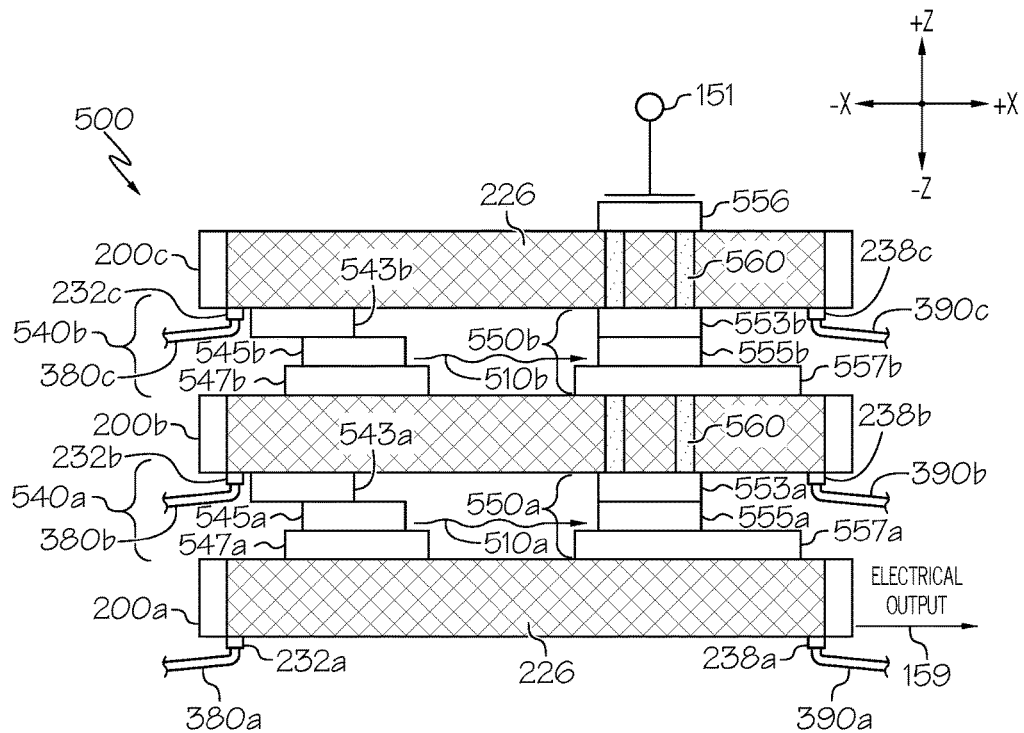
FIG. 5A schematically depicts a cross-sectional side view of an example power electronics assembly having an opticondistor and multiple embedded active cooling chips stacked vertically, where the photonic cores positioned between two successive cooling chips are connected by thru-silicon vias, according to one or more embodiments described and illustrated herein.

FIG. 5A schematically depicts a cross-sectional side view of an example power electronics assembly 500 having an opticondistor (such as the example opticondistor 100 shown in FIG. 1) and multiple embedded active cooling chips 200a, 200b, 200c arranged as a parallel layer in a vertical stack. Each of the cooling chips 200a, 200b, 200c is similar to the cooling chip 200 described above. In the embodiment shown in FIG. 5A, the power electronics assembly 500 has two photonic cores 555a, 555b each positioned between any two of the three cooling chips 200a, 200b, 200c, though in other embodiments, there may be more than two photonic cores and more than three cooling chips. The double-sided cooling enhances cooling efficiency such that the power electronics assembly 500 can achieve high-voltage levels. The cooling chip 200a has a fluid inlet 232a fluidly coupled to a fluid injection conduit 380a and a fluid outlet 238a fluidly coupled to a fluid extraction conduit 390a. Similarly, the cooling chip 200b has a fluid inlet 232b fluidly coupled to a fluid injection conduit 380b and a fluid outlet 238b fluidly coupled to a fluid extraction conduit 390b; the cooling chip 200c has a fluid inlet 232c fluidly coupled to a fluid injection conduit 380c and a fluid outlet 238c fluidly coupled to a fluid extraction conduit 390c. The first cooling chip 200a has a first metallization layer 547a and a second metallization layer 557a provided on a top surface thereof, while the second cooling chip 200b has a first metallization layer 547b and a second metallization layer 557b provided on a top surface thereof.

In the embodiment shown in FIG. 5A, the power electronics assembly 500 has two light source subassemblies 540a and 540b and two photonic core subassemblies 550a and 550b. The light source subassembly 540a and the photonic core subassembly 550a are mounted on the cooling chip 200a. The light source subassembly 540a has a light source 545a coupled to a bottom surface of a first electrode 543a and the metallization layer 547a, which provides a second electrode. The first electrode 543a supports the cooling chip 200b on a top surface thereof. The photonic core subassembly 550a has a photonic core 555a coupled to a bottom surface of a third electrode 553a and the metallization layer 557a, which provides a fourth electrode to allow a current to flow between the third electrode 553a and the metallization layer 557a through the photonic core 555a. The third electrode 553a supports the cooling chip 200b on a top surface thereof. In some embodiments, an intermediate electrically-conducting substrate (not shown) may be placed between the light source 545a and the cooling chip 200a or between the photonic core 555a and the cooling chip 200a such that the light source 545a aligns with the photonic core 555a.

The light source subassembly 540b and photonic core subassembly 550b are similarly mounted on the cooling chip 200b. The light source subassembly 540b has a light source 545b coupled to a bottom surface of a first electrode 543b and the metallization layer 547b, which provides a second electrode. The first electrode 543b supports the cooling chip 200c on a top surface thereof. The photonic core subassembly 550b has a photonic core 555b coupled to a bottom surface of a third electrode 553b and the metallization layer 557b, which provides a fourth electrode to allow a current to flow between the third electrode 553b and the metallization layer 557b through the photonic core 555b. The third electrode 553b supports the cooling chip 200c on a top surface thereof. In some embodiments, an intermediate electrically-conducting substrate (not shown) may be placed between the light source 545b and the cooling chip 200b or between the photonic core 555b and the cooling chip 200b such that the light source 545b aligns with the photonic core 555b.

A metallization layer 556 is provided on a portion of the top surface of the cooling chip 200c and coupled to a third terminal 151. While in FIG. 5A, the metallization layer 556 is coupled to the cooling chip 200c, in other embodiments the metallization layer 556 is coupled to the highest cooling chip in the vertical stack of cooling chips. The third electrode 553a of the photonic core subassembly 550a is electrically connected to the metallization layer 557b of the photonic core subassembly 550b on the cooling chip 200b above, while the third electrode 553b of the photonic core subassembly 550b is electrically connected to the metallization layer 556 on the cooling chip 200c above. In some embodiments as shown in FIG. 5A, the electrical connection may be established by thru-silicon vias (TSVs) 560 etched through the cooling chips 200*b*, 200*c*, for example through the fins 226 (shown in FIGS. 2C and 2D) in the cooling chips 200*b*, 200*c*. The TSVs 560 may comprise an electrically-conductive material such as, but not limited to, aluminum, copper, copper oxide, graphite, brass, gold, silver, platinum, or the like.

Figure 5B:
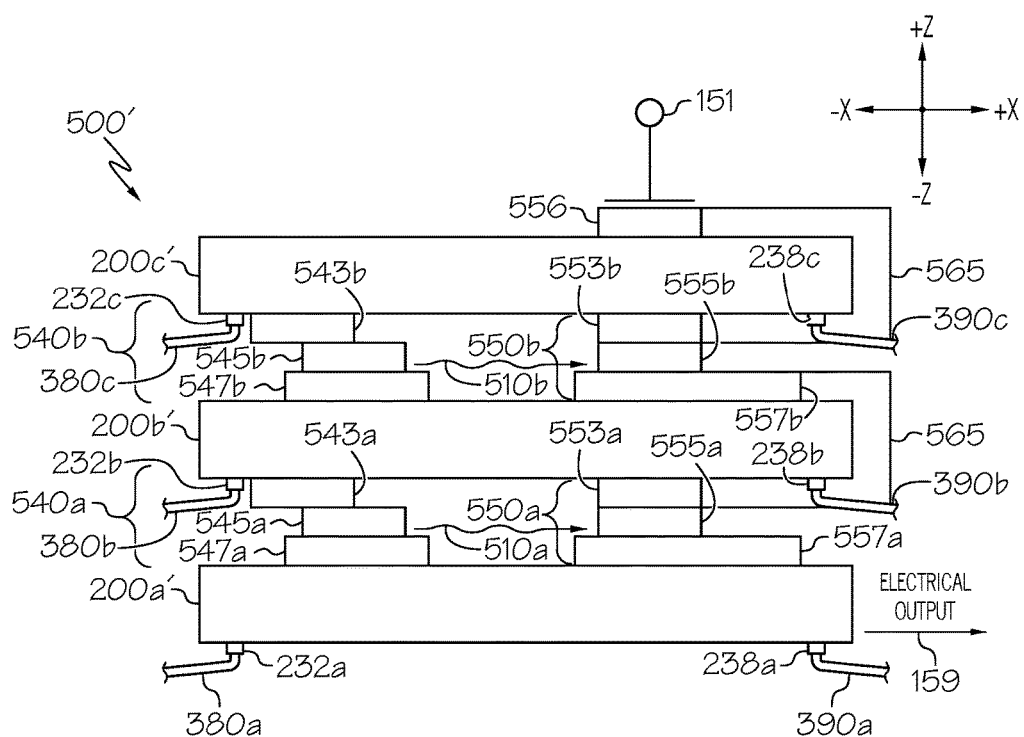
FIG. 5B schematically depicts a side view of an example power electronics assembly having an opticondistor and multiple embedded active cooling chips stacked vertically, where the photonic cores positioned between two successive cooling chips are connected by metal electrodes, according to one or more embodiments described and illustrated herein.

FIG. 5B illustrates a power electronics assembly 500' including the cooling chips 200*a*', 200*b*', 200*c*' similar to the embodiment shown in FIG. 5A, except the electrical connection between the stacked photonic cores 555*a*, 555*b*, 555*c* is established by metal electrodes 565 around the periphery of the cooling chips 200*b*', 200*c*' above the third electrodes 553*a*, 553*b*. For example, the electrodes 565 may be a metal plating that wraps around the edges of the cooling chips 200*b*', 200*c*'.

Referring both to FIGS. 5A and 5B, each of the light sources 545*a* and 545*b* are configured to receive an electrical signal through either the first terminal 141 (shown in FIG. 1) coupled to the first electrodes 543*a*, 543*b* or the second terminal 149 (shown in FIG. 1) coupled to the metallization layers 547*a*, 547*b*. Accordingly, light beams 510*a* and 510*b* are generated respectively in response to the electrical signal flowing between the first electrodes 543*a*, 543*b* and the metallization layers 547*a*, 547*b*. The photonic core 555*a* is positioned to receive the light beam 510*a*, while the photonic core 555*b* is positioned to receive the light beam 510*b*. In some embodiments, the light beams 510*a*, 510*b* may travel between the light sources 545*a*, 545*b* and the photonic cores 555*a*, 555*b* either through air or through an optical element such as, but not limited to, one or more optical fibers, prisms, or mirrors (not shown). In response to the light beams 510*a* and 510*b* received on the photonic cores 555*a* and 555*b* respectively, an electric current flows between the third terminal 151 coupled to the metallization layer 556 and the fourth terminal 159 coupled to the metallization layer 557*a*.

Figure 6:
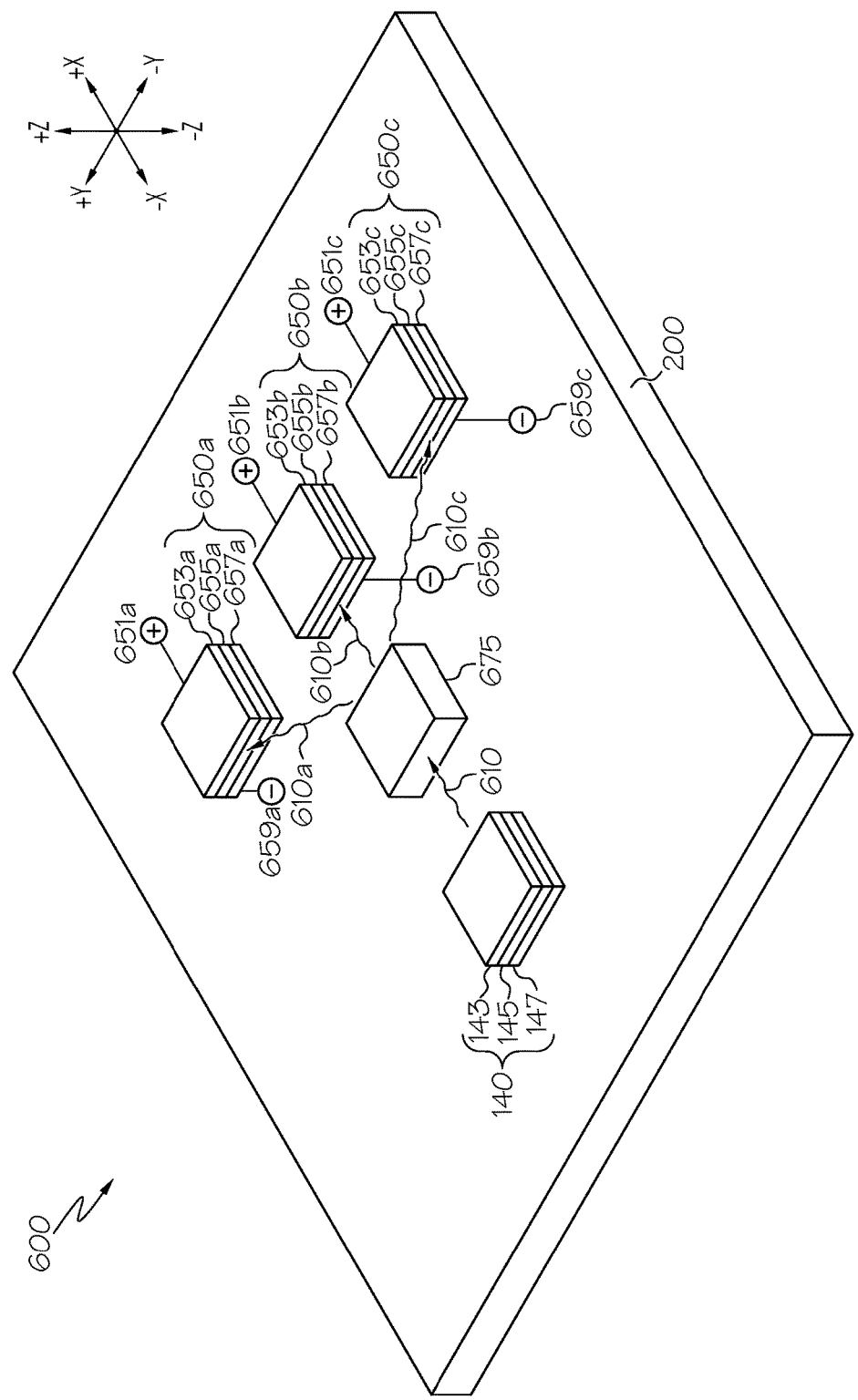
FIG. 6 schematically depicts an example power electronics assembly having an opticondistor and an embedded active cooling chip, where the opticondistor has multiple photonic cores connected in parallel and laterally spaced apart from each other on the cooling chip, according to one or more embodiments described and illustrated herein.

FIG. 6 schematically depicts an example power electronics assembly 600 having an opticondistor (such as the example opticondistor 100 shown in FIG. 1) and an embedded active cooling chip 200, where the power electronics assembly 600 has multiple photonic cores which are connected in parallel and laterally spaced apart from each other on the cooling chip 200. In the embodiment shown in FIG. 6, the power electronics assembly 600 has three photonic cores 655*a*, 655*b*, 655*c* that are laterally spaced apart from each other on the cooling chip 200, though in other embodiments, there may be two or more photonic cores similarly arranged. The power electronics assembly 600 has a first subassembly 140 and three photonic core subassemblies 650*a*, 650*b* and 650*c*, all of which are mounted on the cooling chip 200. The first subassembly 140 has a light source 145 coupled to a first electrode 143 and the metallization layer 147, which acts as the second electrode. In the embodiment shown in FIG. 6, each of the photonic core subassemblies 650*a*, 650*b*, 650*c* has a photonic core 655*a*, 655*b*, 655*c*. Each of the photonic cores 655*a*, 655*b*, 655*c* is coupled to a third electrode 653*a*, 653*b*, 653*c* and a metallization layer 657*a*, 657*b*, 657*c*, which acts as the fourth electrode to allow a current to flow between the third electrode 653*a*, 653*b*, 653*c* and the metallization layer 657*a*, 657*b*, 657*c* through the photonic core 655*a*, 655*b*, 655*c*. Each of the photonic core assemblies 650*a*, 650*b*, 650*c* has a third terminal 651*a*, 651*b*, 651*c* coupled to the third electrode 653*a*, 653*b*, 653*c* and a fourth terminal 659*a*, 659*b*, 659*c* coupled to the metallization layer 657*a*, 657*b*, 657*c*. The metallization layers 147 and 657*a*, 657*b*, 657*c* are provided on the cooling chip 200, as described above and may be patterned together on the cooling chip 200 to achieve parallel electrical connection on the output side of the power electronics assembly 600. In some embodiments, an intermediate electrically-conducting substrate (not shown) may be placed between the light source 145 and the cooling chip 200 or between any of the photonic cores 655*a*, 655*b*, 655*c* and the cooling chip 200 such that the light source 145 aligns with the photonic core 655*a*, 655*b*, 655*c*.

The light source 145 is configured to receive an electrical signal through either the first electrode 143 or the metallization layer 147 and generates a light beam 610 in response to the electrical signal flowing between the first electrode 143 and the metallization layer 147. In some embodiments as shown in FIG. 6, the light beam 610 passes through an optical element 675 such as, but not limited to, a beam splitter which splits the light beam 610 into three beams 610*a*, 610*b*, 610*c* which are incident on the photonic cores 655*a*, 655*b*, 655*c* positioned to receive them respectively. In other embodiments, the light beams 610*a*, 610*b*, 610*c* may travel between the light source 145 and the photonic cores 655*a*, 655*b*, 655*c* through one or more optical fibers, prisms, or mirrors (not shown). In the embodiment shown in FIG. 6, where the photonic core assemblies 650*a*, 650*b*, 650*c* are configured as individual electrical switches, electric current flows between the third terminal 651*a*, 651*b*, 651*c* and the fourth terminal 659*a*, 659*b*, 659*c* in response to the beams 610*a*, 610*b*, 610*c* received on the photonic cores 655*a*, 655*b*, 655*c*. The optical element 675 can be controlled to individually select one or more photonic cores 655*a*, 655*b*, 655*c* for directing one or more of the light beams 610*a*, 610*b*, 610*c* thereto. This can be achieved, for example, by programming a computing device (not shown) coupled to the optical element 675. In some embodiments, multiple light sources may be used to generate multiple beams.

Figure 7:
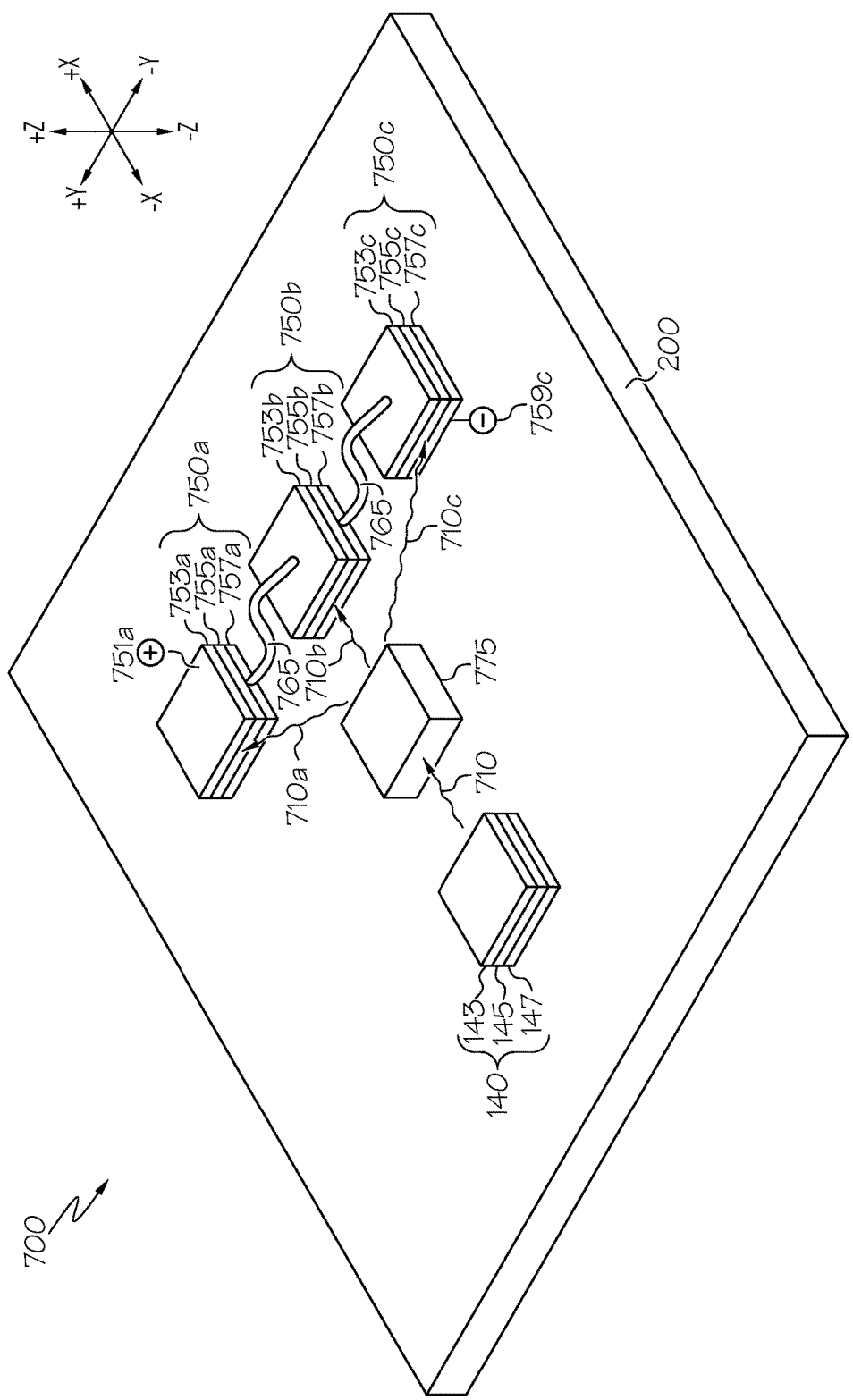
FIG. 7 schematically depicts an example power electronics assembly having an opticondistor and an embedded active cooling chip, where the opticondistor has multiple photonic cores connected in series and laterally spaced apart from each other on the cooling chip, according to one or more embodiments described and illustrated herein.

FIG. 7 schematically depicts an example power electronics assembly 700 having an opticondistor (such as the example opticondistor 100 shown in FIG. 1) and an embedded active cooling chip, where the power electronics assembly 700 has multiple photonic cores which are connected in series and laterally spaced apart from each other on the cooling chip. In the embodiment shown in FIG. 7, the power electronics assembly 700 has three photonic cores 755*a*, 755*b*, 755*c* connected in series and laterally spaced apart from each other on the cooling chip 200, though in other embodiments, there may be two or more three photonic cores similarly arranged. The power electronics assembly 700 has a first subassembly 140 and three photonic core subassemblies 750*a*, 750*b* and 750*c*, all of which are mounted on the cooling chip 200. The first subassembly 140 has a light source 145 coupled to a first electrode 143 and the metallization layer 147, which acts as the second electrode. In the embodiment shown in FIG. 7, each of the photonic core subassemblies 750*a*, 750*b*, 750*c* has the photonic core 755*a*, 755*b*, 755*c*. Each of the photonic cores 755*a*, 755*b*, 755*c* is coupled to a third electrode 753*a*, 753*b*, 753*c* and a metallization layer 757*a*, 757*b*, 757*c*, which acts as the fourth electrode to allow a current to flow between the third electrode 753*a*, 753*b*, 753*c* and the metallization layer 757*a*, 757*b*, 757*c* through the photonic core 755*a*, 755*b*, 755*c*. The photonic core assembly 750*a* has a third terminal 751*a* coupled to the third electrode 753*a* and the photonic core assembly 750*c* has a fourth terminal 759*c* coupled to the metallization layer 757*c*. The metallization layers 147, 757*a*, 757*b*, 757*c* are provided on the cooling chip 200, as described above and may be patterned together on the cooling chip 200 to achieve series electrical connection on the output side of the power electronics assembly 700. The metallization layer 757a of the photonic core subassembly 750a is electrically connected by wirebonds 765 (or lead frame) to the third electrode 753b of the photonic core assembly 750b, while the metallization layer 757b of the photonic core subassembly 750b is electrically connected by wirebonds 765 (or lead frame) to the third electrode 753c of the photonic core assembly 750c. In some embodiments, an intermediate electrically-conducting substrate (not shown) may be placed between the light source 145 and the cooling chip 200 or between any of the photonic cores 755a, 755b, 755c and the cooling chip 200 such that the light source 145 aligns with the photonic core 755a, 755b, 755c.

The light source 145 is configured to receive an electrical signal through either the first electrode 143 or the metallization layer 147 and generates a light beam 710 in response to the electrical signal flowing between the first electrode 143 and the metallization layer 147. In some embodiments as shown in FIG. 7, the light beam 710 may pass through an optical element (not shown) such as, but not limited to, a beam splitter which splits the light beam 710 into three beams 710a, 710b, 710c which are incident on the photonic cores 755a, 755b, 755c positioned to receive them respectively. In other embodiments, the light beams 710a, 710b, 710c may travel between the light source 145 and the photonic cores 755a, 755b, 755c through one or more optical fibers, prisms, or mirrors (not shown). In the embodiment shown in FIG. 7, where the photonic core assemblies 750a, 750b, 750c are arranged in series, electric current flows between the third terminal 751a and the fourth terminal 759c in response to the beams 710a, 710b, 710c received on the photonic cores 755a, 755b, 755c. In some embodiments, multiple light sources may be used to generate multiple beams.

Advantageously, the power electronics assembly described herein converts optical energy into electrical energy at high efficiency and reliability. The opticondistor in the assembly can be quickly and efficiently cooled for optical power transfer applications that require high levels of heat dissipation. The power electronics assembly is constructed by mounting the first subassembly containing the light source on the first metallization layer of the cooling chip. The second subassembly containing the one or more WBG semiconductor photonic cores is then mounted on the second metallization layer such that the photonic cores are exposed to the light beam generated by the light source. During the operation of the opticondistor, the light source generates a substantial amount of heat. This heat flows through the metallization layer into the cooling chip. A cooling fluid is pumped through the fluid inlet of the cooling chip. The cooling fluid may be a dielectric cooling fluid, such as but not limited to, HFE-7100 (methoxy-nonafluorobutane). In some embodiments, the one or more micro-channels in the cooling chip may be coated with a dielectric coating such as, but not limited to aluminum nitride to achieve electrical isolation from an electrically-conducting cooling fluid such as water. The cooling fluid absorbs the generated heat as it flows through one or more micro-channels between the fluid inlet and the fluid outlet. The cooling fluid is pumped out from the fluid outlet of the cooling chip. In some embodiments, the cooling fluid is flowed through a heat exchanger (not shown) remotely located from the cooling chip to dispose the heat therein. The cooling fluid is then rerouted back to the fluid inlet. In some embodiments, the rate of flow of cooling fluid through the micro-channels is adjusted using a micropump (not shown) fluidly coupled to the cooling chip, in response to the amount of heat generated.

The power electronics assembly having an opticondistor and an embedded active cooling chip offers significant benefits. The opticondistor can be used to replace semiconductor devices such as transistors or diodes to achieve operations under higher voltages beyond the breakdown voltages in the corresponding semiconductor p-n junctions. The embedded active cooling chip has advantages over other remote cooling techniques because it reduces the number of intermediate packaging layers, corresponding thermal resistances of the packaging layers as well as the overall package size of the power electronics assembly. Further, the cooling chip minimizes the effects of excess heat generated during operation of the opticondistor and ensures optimal thermal performance of the opticondistor.

The packaging of the first subassembly containing the light source and the second subassembly containing the one or more wide band gap semiconductor photonic cores is designed such that the photonic cores are adequately aligned to receive the maximum exposure to the laser beam generated by the light source. This design ensures a highly efficient performance by the opticondistor in converting optical power to electrical power.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that the various embodiments disclosed herein demonstrate a power electronics assembly having an opticondistor and an embedded active cooling chip. It should also be understood that these embodiments are merely exemplary and are not intended to limit the scope of this disclosure.

What is claimed is:

1. A power electronics assembly comprising:
   a first cooling chip made of a semiconductor material and comprising:
      a first metallization layer and a second metallization layer on a portion of a first surface of the first cooling chip;
      at least one inlet through a second surface of the first cooling chip, wherein the second surface is opposite to the first surface;
      at least one outlet through the second surface of the first cooling chip; and
      one or more micro-channels extending between and fluidly coupled to the at least one inlet and the at least one outlet;
   a first subassembly mounted on the first cooling chip, the first subassembly comprising a first light source coupled to the first metallization layer and a first electrode, the first light source configured to receive an electrical signal and operable to produce light in response to the electrical signal, wherein the first metallization layer provides a second electrode; and
   a second subassembly mounted on the first cooling chip, the second subassembly comprising one or more photonic cores positioned to receive the light produced by the first light source, wherein the one or more photonic cores comprise a wide band gap semiconductor material.

2. The power electronics assembly of claim 1, wherein:
each photonic core of the second subassembly is coupled to the second metallization layer and a third electrode;
the second metallization layer provides a fourth electrode to allow an electric current to flow between the third electrode and the fourth electrode;
one or both of the first electrode and the second electrode are operable as input terminals to receive an input-controlling signal; and
the electric current between the third electrode and the fourth electrode is controlled at least in-part by the input-controlling signal.

3. The power electronics assembly of claim 1, wherein the first light source comprises one of: a semiconductor laser, a semiconductor light-emitting diode or a laser bar.

4. The power electronics assembly of claim 1, wherein the one or more photonic cores comprise silicon carbide (SiC) or gallium nitride (GaN).

5. The power electronics assembly of claim 1 further comprising at least one optical element through which light from the first light source reaches the one or more photonic cores, wherein the optical element is one or more of: an optical fiber, a prism, a lens, a mirror, a reflector, a plate or a beam splitter.

6. The power electronics assembly of claim 1 further comprising an intermediate electrically-conducting substrate between the first light source and the first cooling chip or between the one or more photonic cores and the first cooling chip such that the first light source aligns with the one or more photonic cores.

7. The power electronics assembly of claim 1, wherein:
the one or more photonic cores comprises a plurality of photonic cores;
the individual photonic cores of the plurality of photonic cores are laterally spaced apart from each other on the first cooling chip;
each photonic core is coupled to the second metallization layer and a third electrode;
the second metallization layer provides a fourth electrode to allow an electric current to flow between the third electrode and the fourth electrode;
one or both of the first electrode and the second electrode are operable as input terminals to receive an input-controlling signal; and
the electric current between the third electrode and the fourth electrode is controlled at least in-part by the input-controlling signal.

8. The power electronics assembly of claim 1, wherein:
the one or more photonic cores of the second subassembly comprises a plurality of photonic cores stacked vertically with an electrode between any two successive photonic cores;
an uppermost photonic core is coupled to a top electrode and a lowermost photonic core is coupled to the second metallization layer;
the second metallization layer provides a bottom electrode to allow an electric current to flow between the top electrode and the bottom electrode;
one or both of the first electrode and the second electrode are operable as input terminals to receive an input-controlling signal; and
the electric current between the top electrode and the bottom electrode is controlled at least in-part by the input-controlling signal.

9. The power electronics assembly of claim 1 further comprising:
one or more additional cooling chips arranged as a parallel layer above the first cooling chip in a vertical stack, each of the one or more additional cooling chips made of a semiconductor material and comprising:
a third metallization layer and a fourth metallization layer on a portion of a first surface of the cooling chip;
at least one inlet through a second surface of the cooling chip, wherein the second surface is opposite to the first surface;
at least one outlet through the second surface of the cooling chip; and
one or more micro-channels extending between and fluidly coupled to the at least one inlet and the at least one outlet;
a third subassembly mounted on each of the one or more additional cooling chips, the third subassembly comprising a second light source coupled to the third metallization layer and a first surface of a fifth electrode configured to support a cooling chip on an opposite surface thereof, the second light source configured to receive an electrical signal and operable to produce light in response to the electrical signal, wherein the third metallization layer provides a sixth electrode; and
a fourth subassembly mounted on each of the one or more additional cooling chips, the fourth subassembly comprising one or more photonic cores positioned to receive the light produced by the light source, wherein the one or more photonic cores comprise a wide band gap semiconductor material.

10. The power electronics assembly of claim 7, wherein the fourth electrode of each photonic core is electrically connected to the third electrode of an adjacent photonic core to allow an electric current to flow across the plurality of photonic cores in series.

11. The power electronics assembly of claim 7 further comprising at least one optical element through which light from the first light source reaches the plurality of photonic cores, wherein the optical element is one or more of: an optical fiber, a prism, a lens, a mirror, a reflector, a plate or a beam splitter.

12. The power electronics assembly of claim 10, wherein the electrical connection between the fourth electrode of each photonic core and the third electrode of the adjacent photonic core is established through wirebonds or lead frame.

13. The power electronics assembly of claim 8 further comprising at least one optical element through which light from the first light source reaches the plurality of photonic cores, wherein the optical element is one or more of: an optical fiber, a prism, a lens, a mirror, a reflector, a plate or a beam splitter.

14. The power electronics assembly of claim 9, wherein:
each photonic core of the fourth subassembly is coupled to the fourth metallization layer and a first surface of a seventh electrode configured to support a cooling chip on an opposite surface thereof;
the fourth metallization layer provides an eighth electrode to allow an electric current to flow between the seventh electrode and the eighth electrode;
one or both of the fifth electrode and the sixth electrode are operable as input terminals to receive an input-controlling signal; and the electric current between the seventh electrode and the eighth electrode is controlled at least in-part by the input-controlling signal, wherein the third electrode of the first cooling chip is electrically connected to the eighth electrode of the cooling chip located directly above the first cooling chip and the seventh electrode of each of the one or more additional cooling chips is electrically connected to the eighth electrode of the cooling chip located directly above each of the one or more additional cooling chips.

15. The power electronics assembly of claim 9, wherein the first light source and the second light source comprise one of: a semiconductor laser, a semiconductor light-emitting diode or a laser bar.

16. The power electronics assembly of claim 9, wherein the one or more photonic cores in each of the second subassembly and the fourth subassembly comprise silicon carbide (SiC) or gallium nitride (GaN).

17. The power electronics assembly of claim 9 further comprising at least one optical element through which light from the first light source reaches the one or more photonic cores in the second subassembly and at least one optical element through which light from the second light source reaches the one or more photonic cores in the fourth subassembly, wherein the optical element is one or more of: an optical fiber, a prism, a lens, a mirror, a reflector, a plate or a beam splitter.

18. The power electronics assembly of claim 14, wherein the third electrode of the first cooling chip is electrically connected to the eighth electrode of the cooling chip located directly above the first cooling chip and the seventh electrode of each of the one or more additional cooling chips is electrically connected to the eighth electrode of the cooling chip located directly above the respective additional cooling chip by thru-silicon vias (TSVs).

19. The power electronics assembly of claim 14, wherein the third electrode of the first cooling chip is electrically connected to the eighth electrode of the cooling chip located directly above the first cooling chip and the seventh electrode of each of the one or more additional cooling chips is electrically connected to the eighth electrode of the cooling chip located directly above the respective additional cooling chip by metal electrodes around the periphery of the cooling chip located directly above the first cooling chip and each of the one or more additional cooling chips respectively.

20. A power electronics assembly comprising:
a first semiconductor cooling chip, a second semiconductor cooling chip and a third semiconductor cooling chip arranged as a parallel layer in a vertical stack, each of the first semiconductor cooling chip and the second semiconductor cooling chip comprising:
  a first metallization layer and a second metallization layer on a portion of a top surface of the respective semiconductor cooling chip;
  at least one inlet through a bottom surface of the respective semiconductor cooling chip;
  at least one outlet through the bottom surface of the respective semiconductor cooling chip; and
  one or more micro-channels extending between and fluidly coupled to the at least one inlet and the at least one outlet;
a first subassembly mounted on each of the first semiconductor cooling chip and the second semiconductor cooling chip, the first subassembly comprising a first light source coupled to the first metallization layer and to a bottom surface of a first electrode configured to support a semiconductor cooling chip on a top surface thereof, the first light source configured to receive an electrical signal and operable to produce light in response to the electrical signal, wherein the first metallization layer provides a second electrode; and
a second subassembly mounted on each of the first semiconductor cooling chip and the second semiconductor cooling chip, the second subassembly comprising one or more photonic cores positioned to receive the light produced by the first light source, wherein the one or more photonic cores comprise a wide band gap semiconductor material; and
a third metallization layer on a portion of a top surface of the third semiconductor cooling chip, wherein:
each photonic core of the second subassembly is coupled to the second metallization layer and a bottom surface of a third electrode configured to support the third semiconductor cooling chip on a top surface thereof;
the second metallization layer provides a fourth electrode to allow an electric current to flow between the third electrode and the fourth electrode;
one or both of the first electrode and the second electrode are operable as input terminals to receive an input-controlling signal;
the electric current between the third electrode and the fourth electrode is controlled at least in-part by the input-controlling signal; and
the third electrode of the first semiconductor cooling chip is electrically connected to the fourth electrode of the second semiconductor cooling chip and the third electrode of the second semiconductor cooling chip is electrically connected to the third metallization layer of the third semiconductor cooling chip.

* * * * *